(12) United States Patent
Katagiri et al.

(10) Patent No.: US 6,734,103 B2
(45) Date of Patent: May 11, 2004

(54) METHOD OF POLISHING A SEMICONDUCTOR DEVICE

(75) Inventors: Souichi Katagiri, Kodaira (JP); Ui Yamaguchi, Saitama (JP); Seiichi Kondo, Kokubunji (JP); Kan Yasui, Kodaira (JP); Yoshio Kawamura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 12 days.

(21) Appl. No.: 10/081,212

(22) Filed: Feb. 25, 2002

(65) Prior Publication Data

US 2002/0160609 A1 Oct. 31, 2002

(30) Foreign Application Priority Data

Apr. 25, 2001 (JP) .................................. 2001-127043

(51) Int. Cl.[7] ...................... H01L 21/302; H01L 21/461
(52) U.S. Cl. .................... 438/692; 438/633; 438/693
(58) Field of Search .......................................... 438/692

(56) References Cited

U.S. PATENT DOCUMENTS

| | | | |
|---|---|---|---|
| 4,954,142 A | 9/1990 | Nenadic et al. | |
| 5,770,095 A | 6/1998 | Sasaki et al. | |
| 5,972,792 A | 10/1999 | Hudson | |
| 6,083,840 A | * 7/2000 | Mravic et al. | 438/693 |
| 6,204,169 B1 | * 3/2001 | Bajaj et al. | 438/645 |
| 6,251,789 B1 | * 6/2001 | Wilson et al. | 438/693 |
| 6,436,811 B1 | * 8/2002 | Wake et al. | 438/633 |
| 6,436,829 B1 | * 8/2002 | Layadi et al. | 438/691 |
| 6,468,913 B1 | * 10/2002 | Pasqualoni et al. | 438/693 |
| 6,476,491 B2 | * 11/2002 | Harada et al. | 257/758 |
| 6,524,376 B2 | * 2/2003 | Aoki et al. | 106/14.42 |
| 6,541,384 B1 | * 4/2003 | Sun et al. | 438/692 |

FOREIGN PATENT DOCUMENTS

| | | |
|---|---|---|
| JP | 2-278822 | 3/1990 |
| JP | 8-83780 | 3/1996 |
| JP | 2000-049122 | 7/1998 |

OTHER PUBLICATIONS

Vilas Koinkar, Reza Golzarian, Quiliang Luo, Matthew Van Hanechem, Jim Shen and Peter Burke, "Chemical mechanical planarization of copper interconnects using fixed abrasive polishing pad," 2000 Chemical Mechanical Planarization for ULSI Multilevel Interconnection Conference, Mar. 2000, pp. 58–65.

"New material and process technology for next generation ULSI multi–layered wirings", Technical Information Society, pp. 242–246.

* cited by examiner

Primary Examiner—John F. Niebling
Assistant Examiner—Angel Roman
(74) Attorney, Agent, or Firm—Reed Smith LLP; Stanley P. Fisher, Esq.; Juan Carlos A. Marquez, Esq.

(57) ABSTRACT

A method of manufacturing is described wherein a semiconductor device has a substrate as workpiece with an insulation film formed on the substrate, openings formed inside the insulation film, a first conductive film is formed inside the openings and on a surface of the insulation film, a second conductive film is formed on the first conductive film, and the first and the second conductive films are formed inside openings by planarizing a surface of second conductive film and a surface part of the first conductive film with a fixed abrasive tool. The method includes supplying a first processing liquid, planarizing the surface of the second conductive film with the first processing liquid and the fixed abrasive tool, switching the supply of liquid from a first processing liquid to a second processing liquid, and planarizing the surface of second conductive film and the surface of part of the first conductive film with the second processing liquid and the fixed abrasive tool.

14 Claims, 6 Drawing Sheets

METHOD OF POLISHING A SEMICONDUCTOR DEVICE

BACKGROUND OF THE INVENTION

This invention relates to a polishing or grinding technique for planarizing the surface of a substrate and, more in particular, it relates to a method and an apparatus for manufacturing semiconductor integrated circuits in which thin films formed on semiconductor substrates are subjected to polishing or grinding.

In recent years, a planarizing technique has become important for shallow trench isolation, and formation of tungsten plugs and formation of wiring layers for transmission of signals from each of transistor elements to wiring layers in the manufacture of semiconductor integrated circuits. For the planarization, a polishing technique referred to as chemical mechanical polishing (CMP) is typical.

In particular, copper has been used recently for wiring materials. A damascene method is predominant in the planarization, which is disclosed in, for example, Japanese Patent Laid-Open Hei 2-278822 and Japanese Patent Laid-Open Hei 8-83780.

When copper is used as a wiring material, it can provide a merit in view of durability and lowering of resistance value as compared with existent aluminum wirings but, on the contrary, it requires consideration for insulation failure caused by conductive ions such as diffusion into oxide films. In the damascene method, as shown in FIG. 2, diffusion is prevented by depositing a barrier film 14 at the boundary between an oxide film 13 and copper 15 as the wiring material. By the presence of the barrier film 14, copper 15 is buried into trenches by way of the steps from FIG. 2I to in FIG. 2III by the damascene method.

In the formation of the copper wirings by the damascene method, control of the processing speed for the copper 14 and the barrier film 14 is important. Generally, since the processing speed for the barrier film (mainly Ta, TaN) is lower as compared with that for copper, copper is ground excessively when processing is continuously applied from FIG. 2I to in FIG. 2III all at once. In view of the above, plural kinds of slurries are provided separately, such as a slurry for polishing copper at a high speed, a slurry for polishing the barrier film at a high speed while polishing copper at a low speed, or a slurry capable of polishing copper, barrier film and oxide film at an equal speed. The actual CMP step adopts a method of conducting the step I by using a slurry of polishing copper at a high speed and then conducting the step in FIG. 2II by applying a slurry capable of polishing a barrier film while changing a polishing disk. As the case may be, it sometimes use a slurry capable of processing copper, barrier film and oxide film at an identical speed as the third step CMP, thereby improving the planarity and reducing scratches.

Another prior art technique includes a method of using fixed abrasive grains for the planarization of copper. A sheet in which alumina abrasives are fixed with a resin is used and it has a feature of not requiring a slurry containing free abrasives. However, the method still requires CMP at 2 to 3 steps for removing the barrier film 14. This technique is described in the proceedings: "2000 Chemical Mechanical Planarization for ULSI Multilevel Interconnection Conference", in pp. 58–65.

Further, as other prior art using fixed abrasive tool, an example is described in U.S. Pat. No. 5,972,792. This is a method of planarization while preventing etching to a workpiece by controlling pH of a processing solution. This technique also belongs to a multistep planarization method of changing the polishing method on every workpiece for each layer using the fixed abrasive tool.

In a case of practicing planarization of the damascene method described above using CMP, there are several problems. One of them is attributable to that Ta or TaN used for the barrier film 14 is harder than copper, so that two or more steps of CMP have to be applied while separately conducting CMP for copper 15 and the barrier film 14, which results in increased cost, lowering of throughput and increase in the environmental load due to increase of waste slurry.

As another problem, since the polishing pad is soft, dishing and erosion which forms recesses on the surface of wirings as shown in FIG. 4 are produced and, as a result, variation for the value of the wiring resistance increases. In particular, this gives a significant problem in a logic device called as a system LSI having a multi-layered wiring structure as shown in FIG. 7. That is, when the planarity of the lower layer is low as shown in FIG. 6, it impairs the planarity beyond the performance of CMP to cause a fatal defect that short circuit or disconnection tends to occur between wirings by polishing residue. This is described in "New Material and Process Technology for Next Generation ULSI Multi-layered wirings", by technical information society, in pp. 242–246.

This invention intends to provide a method and an apparatus for manufacturing a semiconductor device with improved throughput by constituting CMP steps with a single step in order to overcome the foregoing problems.

This invention further intends to provide a manufacturing method of a semiconductor device for improving the yield including the reduction of variation of the wiring resistance value and reduction of the disconnection failure by reducing dishing and erosion.

SUMMARY OF THE INVENTION

To attain the foregoing object, this invention provides a method for manufacturing a semiconductor device wherein for a substrate as a workpiece in which an insulation film is formed to the substrate, openings are formed in the insulation film, a first conductive film (for example, a barrier film) is formed in the inside of the openings and on the surface of the insulation film, and a second conductive film (for example, a copper film) is formed on the first conductive film, by planarizing the second conductive film and part of the first conductive film using a fixed abrasive tool, the first and the second planarized conductive film are formed in the openings, said method comprising: supplying a first processing liquid upon planarization of the second conductive film and switching the supply of the liquid from the first processing liquid to the second processing liquid upon planarization of the second and the first conductive film.

Further, this invention provides A method for manufacturing a semiconductor device wherein for a substrate as a workpiece in which an insulation film is formed to the substrate, openings are formed in the insulation film, a first conductive film (for example, a copper film) is formed in the inside of the openings and on the surface of the insulation film, and a second conductive film (for example, a copper film) is formed on the first conductive film, by planarizing the second conductive film and part of the first conductive film using a fixed abrasive tool, the first and the second planarized conductive film are formed in the openings, said method comprising: dressing the surface of the fixed abrasive tool before planarization of the second and the first conductive film.

Further, this invention provides a method of manufacturing a semiconductor device as described above, wherein the distance of the insulative film between adjacent openings is within a range of 30 μm to 0.1 μm, and dishing and erosion on the planarized surface is 40 nm or less.

Further, this invention provides a method of manufacturing a semiconductor device as described above, wherein each of the first and the second processing liquids contains an oxidizing agent, an organic acid, a corrosion inhibitor and purified water.

Further, this invention provides a method of manufacturing a semiconductor device as described above, wherein each of the first and the second processing liquids contain aqueous hydrogen peroxide, malic acid, benzotriazole and purified water.

Further, this invention provides a method manufacturing a semiconductor device as described above, wherein each of the first and the second processing liquid contains from 0.5 to 50% of aqueous hydrogen peroxide, from 0.1 to 0.2% of malic acid and from 0.1 to 0.4% of benzotriazole.

Further, this invention provides a method of manufacturing a semiconductor device as described above, wherein the concentration of the oxidizing agent is different between the first and the second processing liquid.

DESCRIPTION OF THE ACCOMPANYING DRAWINGS

FIG. 1 is a view for explaining the constitution of an apparatus according to this invention;

FIGS. 2I to 2III are views for explaining the processing steps according to this invention;

DESCRIPTION OF THE PREFERRED EMBODIMENTS

This invention will be explained by way of preferred embodiments with reference to the drawings.

Figure 1:
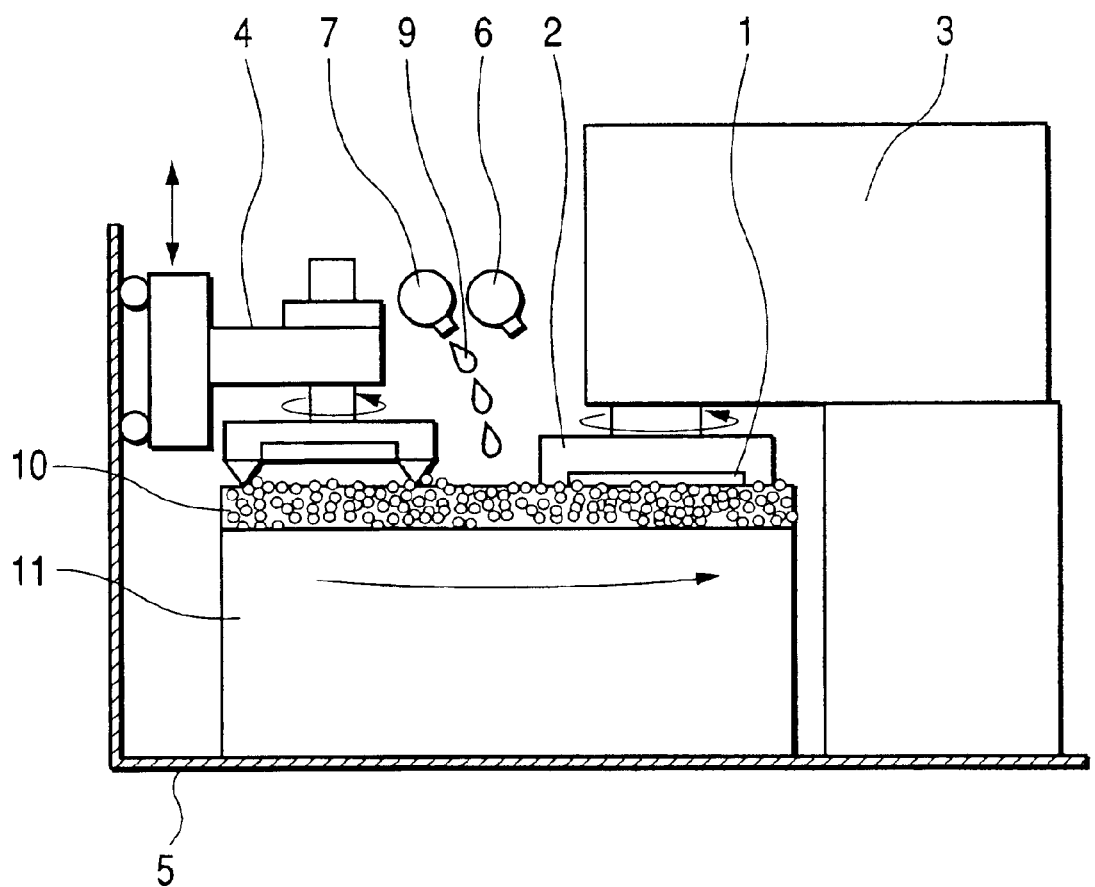
Figure 2:
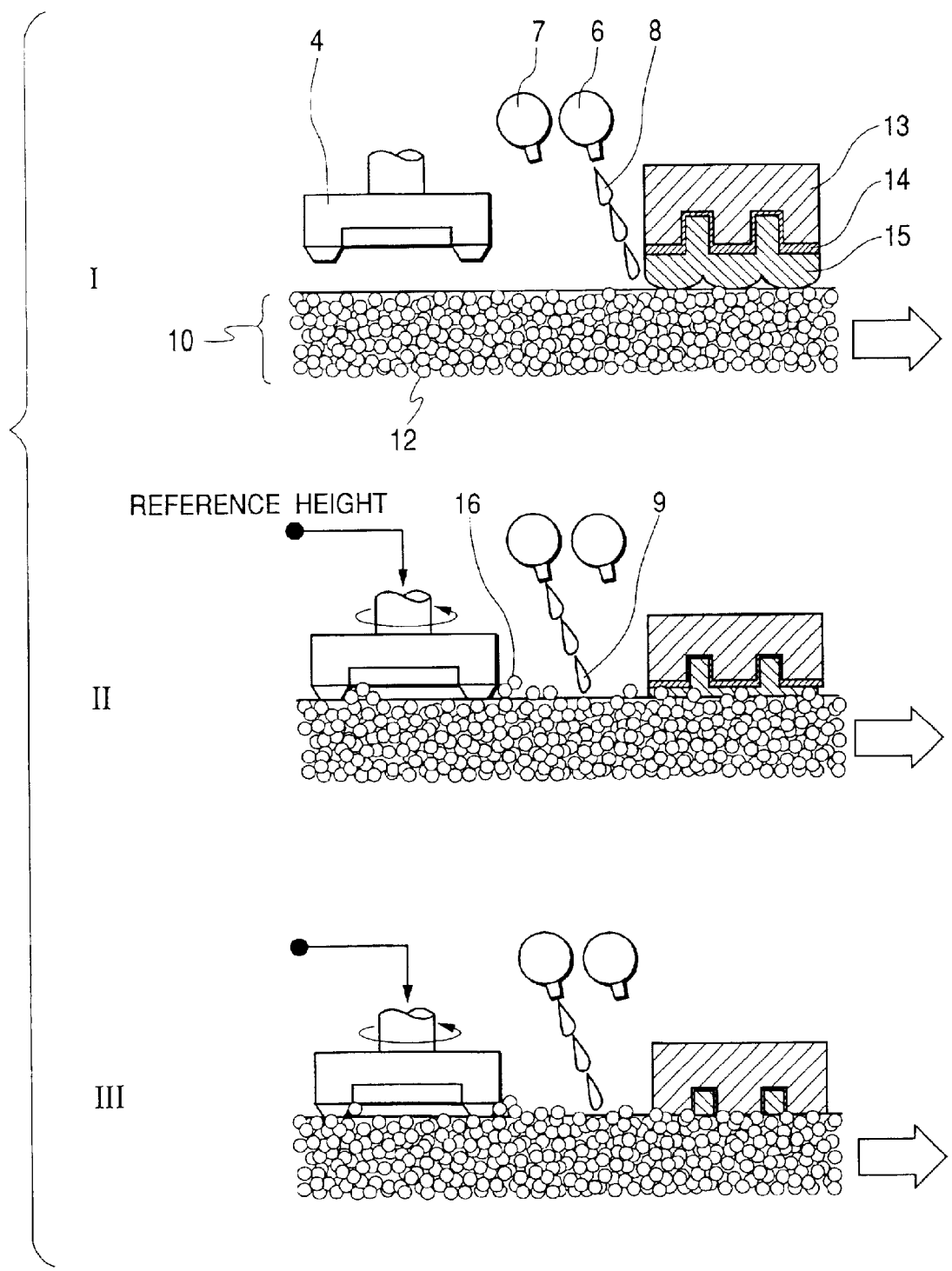

A preferred embodiment of this invention will be explained with reference to FIG. 1 and FIG. 2. To modify the existent multi-step CMP into a single step, a fixed abrasive tool and a dressing are combined and processing liquids are changed during processing. At first, a fixed abrasive tool 10 is required to have a performance capable of processing copper 15 and barrier film 14 and not injuring oxide film 13. It is necessary that the abrasive grains 12 have such a hardness equal to or more than the barrier film material has and equal to or less than the oxide film has. When Ta is selected for the barrier film, since the Mohs hardness thereof is 6.5 and that of the oxide film (silicon oxide film) is 7, silica having a Mohs hardness of 7 can satisfy the requirement. When the silica abrasive grains are exerted effectively on the barrier film, planarization can be conducted. Actually, in the stage I in FIG. 2, the abrasive grains on the surface of the fixed abrasive tool (grain disk) 10 are dropped along with processing for copper, or are surrounded with the fixing resin to cause a so-called filled-up state, which reduces the effective density of abrasive grains to the polishing processing for the surface of the fixed abrasive tool.

A sizing dresser 4 is used to recover to an initial state. The sizing dresser 4 has a constitution capable of position control for the height relative to an absolute reference height and capable of positioning the fixed abrasive grain disk 10 to a surface height position and cutting by a predetermined amount. Then, when the sizing dresser 4 is actuated at the step in FIG. 2II for cutting, for example, by about 1 μm, to expose fresh pure silica abrasive grains, a predetermined processing speed for the barrier film 14 is obtained.

Figure 3:
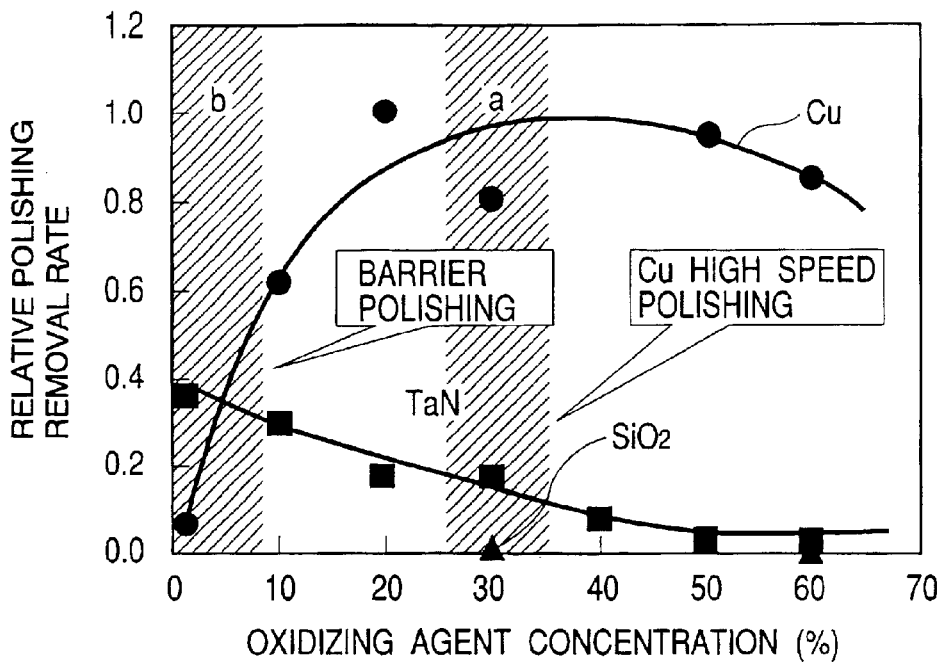
FIG. 3 is a graph for explaining a concentration of a processing liquid chemical and a polishing removal rate in this invention.

On the other hand, each of the processing liquids 8, 9 contains an oxidizing agent, an organic acid, a corrosion inhibitor and purified water, which is supplied by a predetermined amount during processing. The processing speed characteristic of the processing liquid to each of the materials is as shown in FIG. 3 and it can be seen that the processing speed ratio for each of the materials (selective ratio) can be controlled depending on the concentration of the oxidizing agent. For example, when the concentration of the oxidizing agent is about 30%, the processing speed for copper is maximum. When the concentration of the oxidizing agent is about 5%, the processing speed is substantially identical between copper and TaN of the barrier film. In a constitution capable of supplying the processing liquid 1 at an oxidizing agent concentration of about 30% and the processing liquid 2 at an oxidizing agent concentration of about 5% from separate supply systems 6, 7, respectively, single step planarization for copper wiring damascene can be conducted efficiently by dripping the processing liquid 1 in the step in FIG. 2I and replacing it with the processing liquid 2 in the step in FIG. 2II.

Further, to attain high planarity with less damages, a fixed abrasive tool in which fine silica abrasive grains are uniformly dispersed and fixed and having a compression modulus of elasticity of 500 to 1000 MPa is used. This compression modulus of elasticity is higher by 5 to 10 times the existent CMP pad.

(Embodiment 1)

Embodiment 1 for a planarizing apparatus according to this invention will be explained with reference to FIG. 1. A fixed abrasive tool 10 as a fixed abrasive grain tool is fixed on a rotational table 11. A head 2 for holding a wafer 1 is disposed thereabove. The head 2 has a function of holding the wafer 1 and capable of rotation in the direction identical with the rotational disk 11, as well as a function of pressing the surface of the wafer 1 to the fixed abrasive tool 10 to apply a load by a predetermined force. Further, the head 2 is attached for rotation and driving to a swing arm 3 that swings in the radial direction of the fixed abrasive tool 10. Further, the processing liquid 9 is dripped from a supply system 7. The processing liquid supply system in this invention has two systems 6 and 7 as shown in FIG. 1. The processing liquids of the two systems 6, 7 can be switched between each of the liquids and can be controlled for the flow rate. In addition, the apparatus has a sizing dresser 4 capable of smoothly dressing the surface of the fixed abrasive tool 10 as the fixed abrasive grain disk. The sizing dresser 4 has a function capable of positioning in view of the reference plane 5 of the apparatus and has a function capable of cutting by a predetermined amount. The sizing dresser 4 is provided with a cup-shaped dresser secured with diamond abrasive grains and can be driven at a high speed rotation of about 7,000 to 10,000 rpm. The dresser 4 has a constitution capable of smoothing the entire surface of the fixed abrasive tool.

Then, the cross sectional structure of the wafer 1 as a workpiece will be explained with reference to FIG. 2. In this figure, only the constitution for an oxide film (insulation film) 13, a barrier film (first conductive film) 14 and a copper film (second conductive film) 15 are shown with a silicon portion of the wafer substrate being omitted. The oxide film 13 may be made of a low dielectric constant material other than the silicon oxide film and it may be a pair of layers of an oxide film and a dielectric constant material. The oxide film 13 is formed with wiring grooves and the barrier film 14 such as made of Ta or TaN and the copper portion 15 are deposited thereover. The initial shape of the substrate surface before planarization has unevenness as shown in FIG. 2I. The processing is completed when the oxide film 13 is exposed with the copper portion being remained in the grooves formed to the oxide film 13 as in FIG. 2III. In the existent CMP, polishing from FIG. 2I to FIG. 2II is once stopped upon exposure or just before exposure of the barrier film 14, the workpiece is transported to another rotational table and polished while feeding a slurry having a polishing speed for the barrier film relatively higher as compared with that for the copper portion and the processing is completed when the workpiece is flattened to the state in FIG. 2III.

In this invention, a series of fabrication processes described above are conducted on one identical fixed abrasive tool 10. Before processing the wafer 1, the surface of the fixed abrasive tool 10 is dressed by the sizing dresser 4 at a cut-in amount of about 1 μm to a planarization degree of about 10 μm and abrasive grains are exposed to the surface of the fixed abrasive tool 10. Polishing is conducted while feeding the processing liquid 1 from the processing liquid supply system 6 to the surface of the fixed abrasive tool 10. In this state, the sizing dresser 4 is stopped stationary at a position apart from the fixed abrasive tool 10.

The processing liquid 1 contains an oxidizing agent, an organic acid, an inhibitor and purified water, using about 30% of aqueous hydrogen peroxide as an oxidizing agent, about 0.15% of malic acid as an organic acid and about 0.2% of benzotriazole (BTA) as an inhibitor. As shown in FIG. 3, the concentration of aqueous hydrogen peroxide and the polishing removal rate characteristic for each of the materials provide such a characteristic that the copper processing speed is maximized at 30% concentration. This can shorten the processing time per wafer to result in a desired effect of improving the throughput.

Figure 4:
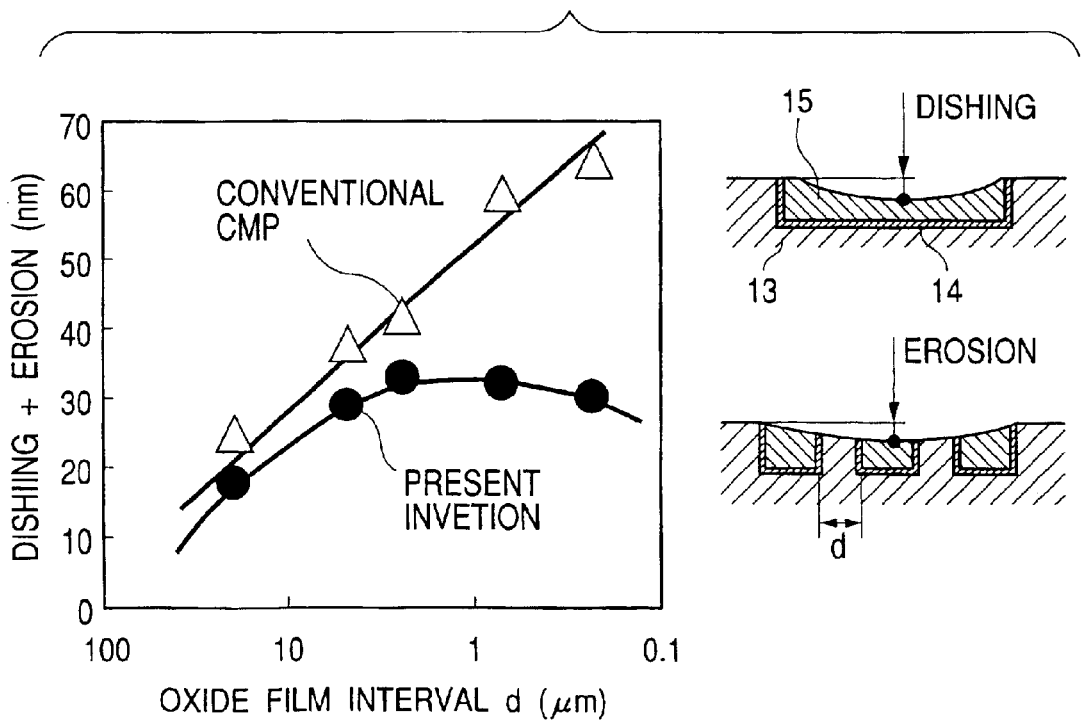
FIG. 4 is a view for explaining the planarizing performance of this invention.

Then, as removal of copper proceeds to attain the state of step in FIG. 2II, the processing liquid 1 is replaced by the processing liquid 2. In this embodiment, it may be conducted by stopping the processing liquid supply system 6 and changing it to the supply of the processing liquid 2 from the processing liquid supply system 7. The ingredient constituent of the processing liquid 2 is identical with that for the processing liquid 1 and contains an oxidizing agent (aqueous hydrogen peroxide), organic acid (malic acid) and inhibitor (BTA). However, the concentration is adjusted such that the processing speed for the copper portion 15 and the barrier film 14 is substantially at 1:1. The adjusting method is conducted by the combination for the control of the oxidizing agent concentration and the sizing dressing by the sizing dresser 4 during processing to be described later, such that the processing speed ratio for the copper portion 15 and the barrier film 14 is 1:1. This is preferred since excessive polishing of copper and oxide film such as dishing or erosion to the planarized surface as shown in FIG. 4 can be prevented.

The sizing dressing at the step in FIG. 2II is a function of lowering the sizing dresser 4 to the height for the surface of the fixed abrasive tool 10, bringing the diamond abrasive grains into contact with the surface of the fixed abrasive tool 10 thereby removing filled-up resin and exposing the fresh abrasive grain surface and generating free abrasive grains 16. The positioning height of the sizing dresser 4 may be identical with the position dressed before planarization or the abrasive grain surface may be cut further by about 1 μm. A number of free abrasive grains 16 are formed by cutting, and thereby the processing speed for the barrier film 14 is improved.

The processing is completed when the barrier film (first conductive film) 14 is removed and the oxide film (insulation film) 13 is exposed. In this case, it is desirable that the processing speed for the oxide film is extremely low as compared with that for the barrier and copper film, because of the effect capable of preventing the reduction of film thickness by over-polishing. In addition, polishing residue can also be prevented by setting the processing time somewhat longer in a case where non-uniformness is left within the wafer plane. For example, assuming the polishing time required for removing most of the barrier film on the surface to be processed as a just polishing time, the processing time may be about 1.3 to 1.5 times the just polishing time.

(Embodiment 2)

In the Embodiment 1 described above, the entire surface of the fixed abrasive tool 10 is dressed by the sizing dresser 4 before planarization to expose the fixed abrasive grain 12 in the surface of the fixed abrasive tool 10 but the step can be saved in this Embodiment 2. Since it has been known that the copper portion 15 can be processed even with no presence of the abrasive grains, dressing before processing is not always indispensable. Further, since the life of the fixed abrasive tool 10 is determined depending on the reduction of the thickness by dressing, the frequency of the dressing should be decreased as much as possible. Also with this view point, it can be said effective to save the dressing before processing.

Accordingly, this Embodiment 2 can planarize the semiconductor wiring structure while saving the dressing before processing among the steps in Embodiment 1. As a result, according to Embodiment 2, a significant effect can be expected in that the life of the fixed abrasive tool 10 can be made longer in addition to planarization of the damascene wiring structure using copper at a reduced cost, with a high throughput high planarization.

(Embodiment 3)

In this Embodiment 3, the result of processing a patterned wafer by applying the planarization method described above will be explained. That is, according to this Embodiment 3, the result shown in FIG. 4 was obtained. The pattern used is a so-called line & space in which copper wirings are arranged periodically with the width for 1 line being about 20 μm. The distance d between each of the patterns is indicated on the horizontal axis and the total of dishing and erosion is indicated on the vertical axis. According to this invention, it can be seen that high planarizing performance can be demonstrated as compared with the existent CMP (dishing and erosion in the planarized surface can be reduced to 40 nm or less within a range of the oxide film distance d of 30 μm to 0.1 μm). The high planarizing performance is a result attributable to the use of a fixed abrasive tool having a compression modulus of elasticity (500 to 1000 MPa), which is higher by 5 to 10 times than that of the existent CMP pad.

Figure 5:
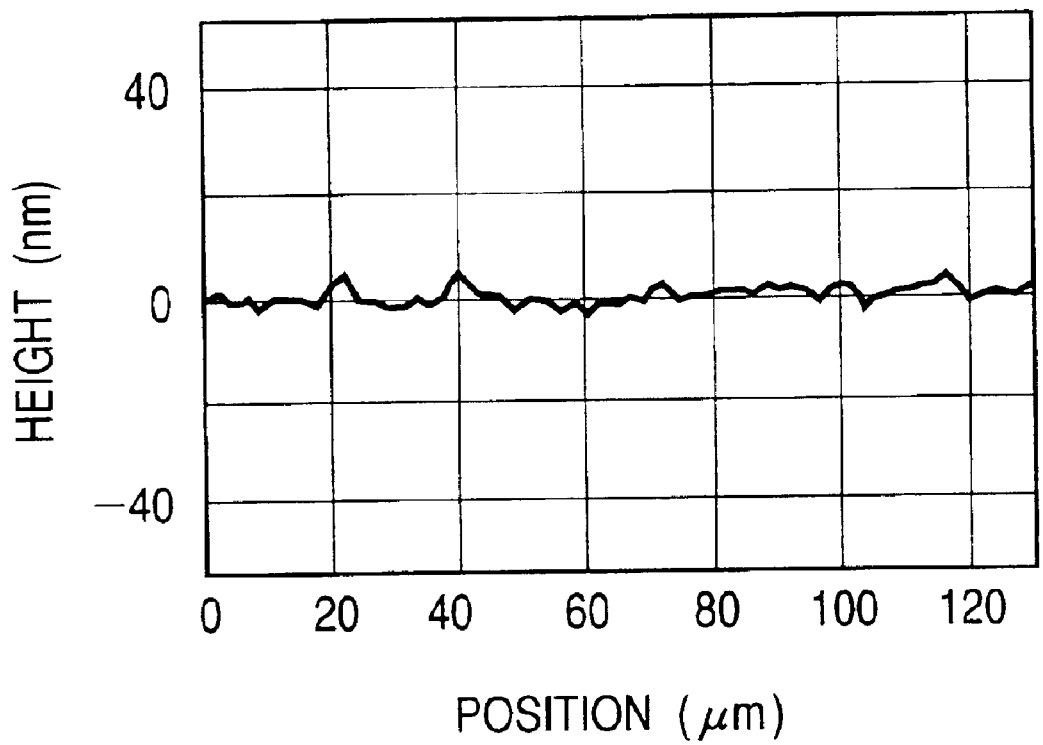
FIG. 5 is a graph for explaining the surface shape of copper after planarization in this invention.

One of the problems in a case of planarization by a hard fixed abrasive tool is scratches. Since highly pure fine fumed silica abrasive grains are homogeneously dispersed and fixed in the fixed abrasive tool according to this invention, it does not include obstacles or large sized grains which may attributable to scratches. Further, since the surface of the fixed abrasive grain disk is dressed smoothly before processing by the sizing dresser 4, it causes less scratches. FIG. 5 shows a result of measuring the surface shape after processing a pattern of 120 μm square of copper. The amplitude for the unevenness of the surface is 10 nm or less and it has been confirmed that the surface attains a mirror face which is sufficient as semiconductor wirings.

(Embodiment 4)

Figure 7:
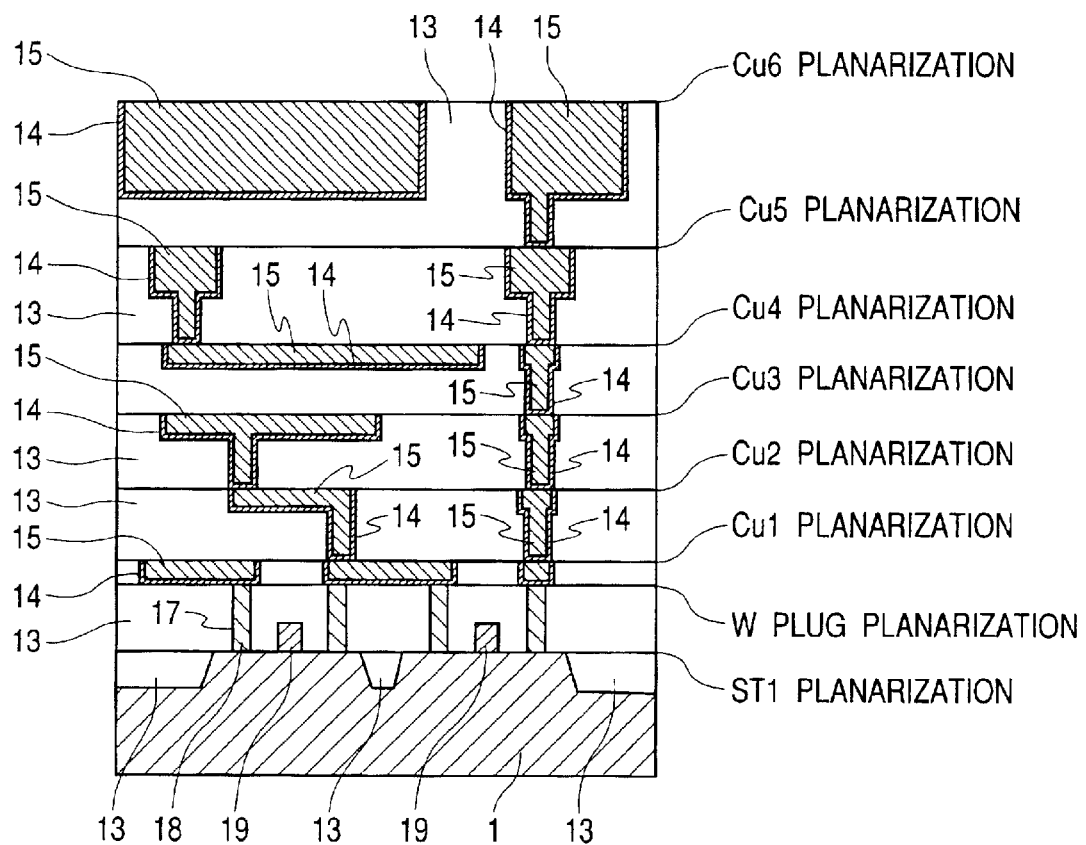
FIG. 7 is a view for explaining the cross section of a semiconductor device having a multi-layered wiring structure according to this invention.

Then, Embodiment 4 in which this invention is actually applied to a semiconductor device will be explained with reference to FIG. 7. This structure has a cross section of a 6-layered multi-layer logic device. After forming shallow trench isolation groove (STI) to the surface of a silicon wafer substrate 1 by an oxide film planarization technique, a gate pattern 19 or the like is formed to form a transistor. Subsequently, a contact plug 18 made of W with an upper wiring layer 15 is formed by a W planarization technique. The W plug 18 is also formed with a barrier film 17 at the boundary with an insulation film 13 like that the copper wiring structure. All the layers above the W plug 18 are copper wiring layers and each of six layers was formed by adopting this invention.

Figure 6:
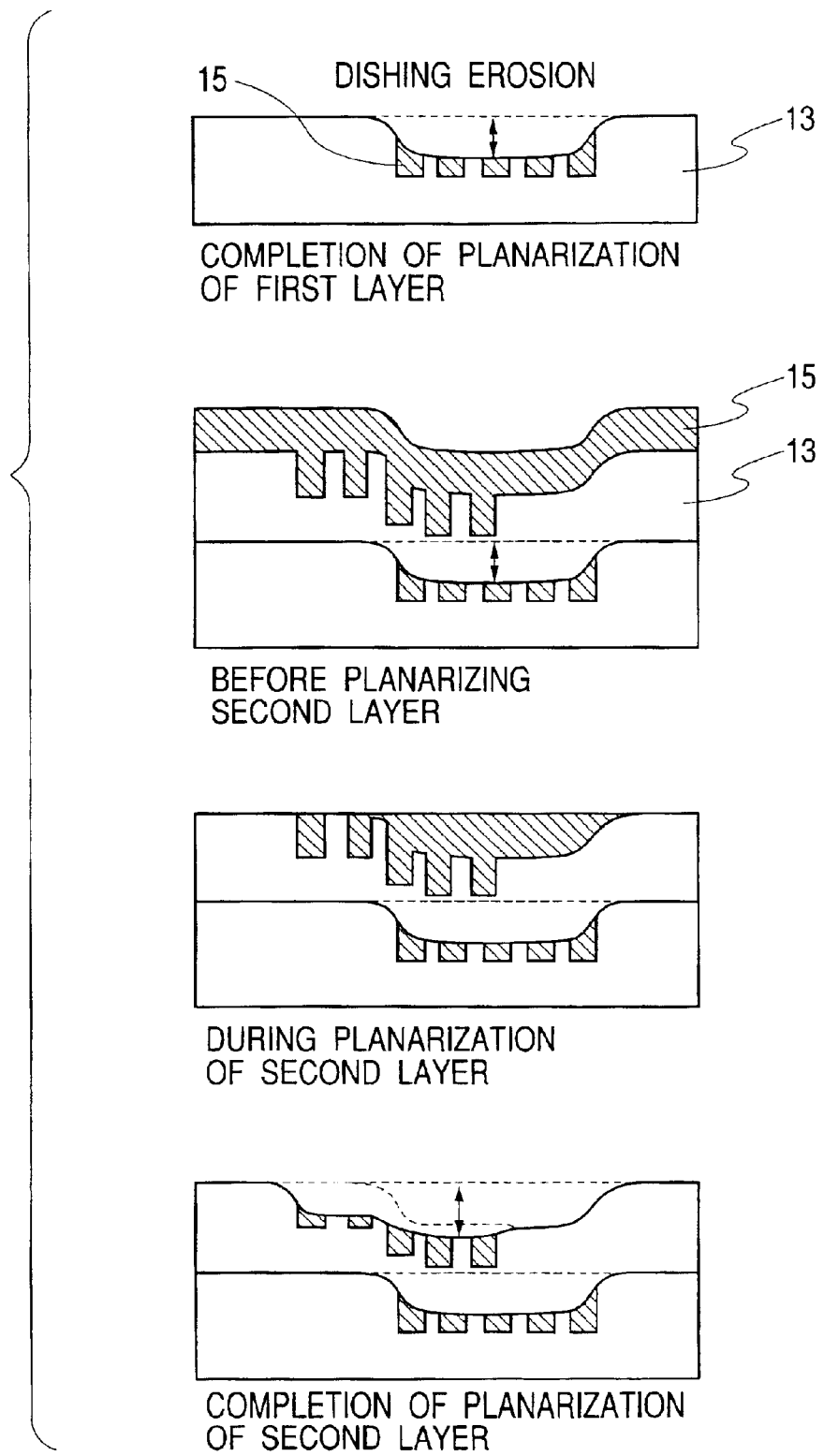
FIG. 6 is a view for explaining the problem caused by insufficiency in the planarizing performance.

Since the underlying layer is planar, it can be seen that satisfactory planarization could be conducted with no polishing residue or dishing and erosion that have been explained with reference to FIG. 6. Further, it will be apparent that a planar semiconductor device can also be manufactured by applying planarization using fixed abrasive grains also regarding the planarization for STI layer and W plug. For example, planarization of the STI layer using fixed abrasive grains is described in Japanese Patent Laid-Open 2000-49122.

This invention provides an effect capable of planarizing by conducting the CMP steps in one single step. The effect for shortening the steps means increase in the number of wafer processed per unit time, which can improve the throughput.

Further, this invention provides an effect capable of reducing dishing and erosion. This effect results in improvement of yield in view of reduction of variation in the wiring resistance value disconnection failure and reduction in the disconnection failure.

What is claimed is:

1. A method for manufacturing a semiconductor device wherein for a substrate as a workpiece in which an insulation film is formed to the substrate, openings are formed in the insulation film, a first conductive film is formed in an inside of the openings and on a surface of the insulation film, a second conductive film is formed on the first conductive film, and the first and the second conductive film are formed in the openings by planarizing a surface of the second conductive film and a surface of part of the first conductive film using a fixed abrasive tool, said method comprising the steps of:

supplying a first processing liquid including about 30% oxidizing agent;

planarizing the surface of the second conductive film with the first processing liquid and said fixed abrasive tool;

switching the supply of the liquid from first processing liquid to a second processing liquid including about 5% oxidizing agent; and planarizing the surface of the second conductive film and the surface of the part of the first conductive film with the second processing liquid and said fixed abrasive tool, wherein a plurality of planarizing steps are constituted in a single planarizing step.

2. A method for manufacturing a semiconductor device according to claim 1, further comprising:

dressing a surface of the fixed abrasive tool before said planarization of the surface of the second conductive film and the surface of the part of the first conductive film.

3. A method for manufacturing a semiconductor device wherein for a substrate as a workpiece in which an insulation film is formed to the substrate, openings are formed in the insulation film, a first conductive film is formed in inside of the openings and on a surface of the insulation film, a second conductive film is formed on the first conductive film, and the first and the second conductive film are formed in the openings by planarizing a surface of the second conductive film and a surface of part of the first conductive film using a fixed abrasive tool, said method comprising the steps of:

supplying a first processing liquid including about 30% oxidizing agent;

planarizing the surface of the second conductive film with the first processing liquid and said fixed abrasive tool;

switching the supply of the liquid from first processing liquid to a second processing liquid including about 5% oxidizing agent;

dressing a surface of the fixed abrasive tool before planarization of the surface of the second conductive film and the surface of the part of the first conductive film; and planarizing the surface of the second conductive film and the surface of the part of the first conductive film with the second processing liquid and said fixed abrasive tool, wherein a plurality of planarizing steps are constituted in a single planarizing step.

4. A method for manufacturing a semiconductor device as defined in claim 1, wherein a distance of the insulative film between adjacent openings is within a range of 30 μm to 0.1 μm, and dishing and erosion on the planarized surface is 40 nm or less.

5. A method for manufacturing a semiconductor device as defined in claim 1, wherein each of the first and the second processing liquid contains an oxidizing agent, an organic acid, a corrosion inhibitor and purified water.

6. A method for manufacturing a semiconductor device as defined in claim 5, wherein each of the first and the second processing liquid contains aqueous hydrogen peroxide, malic acid, benzotriazole and purified water.

7. A method for manufacturing a semiconductor device as defined in claim 6, wherein each of the first and the second processing liquid contains from 0.5 to 50% of aqueous hydrogen peroxide, from 0.1 to 0.2% of malic acid and from 0.1 to 0.4% of benzotriazole.

8. A method for manufacturing a semiconductor device as defined in claim 5, wherein the abrasive grains of the fixed abrasive tool comprise fumed silica and the abrasive grains are fixed with a resin.

9. A method for manufacturing a semiconductor device according to claim 1, wherein said polishing step proceeded with the use of the abrasive tool, said abrasive tool comprising a plurality of abrasive grains including fumed silica and a resin to fix the abrasive grain.

10. A method for manufacturing a semiconductor device as defined in claim 9, wherein the fumed silica abrasive grains are fixed with a resin and a compression modulus of elasticity is from 500 Mpa to 1000 Mpa.

11. A method for manufacturing a semiconductor device as defined in claim 2, wherein the dressing is conducted by using a diamond dresser and the height of the diamond dresser from the surface of the fixed abrasive tool can be positioned.

12. A method for manufacturing a semiconductor device as defined in claim 2, wherein the distance of the insulative film between adjacent openings is within a range of 30 $\mu$m to 0.1 $\mu$m, and dishing and erosion on the planarized surface is 40 nm or less.

13. A method for manufacturing a semiconductor device as defined in claim 3, wherein each of the first and the second processing liquid contains an oxidized agent, an organic acid, a corrosion inhibitor and purified water.

14. A method for manufacturing a semiconductor device as defined in claim 2, wherein the abrasive grains of the fixed abrasive tools comprise fumed silica and the abrasive grains are fixed with a resin.

* * * * *